United States Patent [19]

Kanow

[11] 3,857,108

[45] Dec. 24, 1974

[54] FREQUENCY DRIFT COMPENSATION FOR A VOLTAGE CONTROLLED OSCILLATOR

[75] Inventor: Willy Kanow, Berlin, Germany

[73] Assignee: Loewe-Opta GmbH, Berlin, Germany

[22] Filed: July 6, 1973

[21] Appl. No.: 377,047

[30] Foreign Application Priority Data

July 8, 1972 Germany .......................... 2233724

[52] U.S. Cl. .................................... 331/14, 331/25

[51] Int. Cl. ............................................ H03b 3/04

[58] Field of Search .......................... 331/14, 18, 25

[56] References Cited

UNITED STATES PATENTS

| | | | |
|---|---|---|---|
| 3,297,964 | 1/1967 | Hamilton | 331/14 X |
| 3,297,965 | 1/1967 | Chadima | 331/14 X |
| 3,614,648 | 10/1971 | Byrne | 331/14 |

*Primary Examiner*—John Kominski
*Assistant Examiner*—Siegfried H. Grimm

[57] ABSTRACT

The output frequency of a voltage controlled oscillator in communications receiver is insulated against drift caused by dynamic variations in the conversion factor of an associated device that is arranged to convert the output frequency of the oscillator into a succession of DC pulses of proportional repetition rate. The outputs of the oscillator and of a fixed frequency generator are time multiplexed through the converter with the resulting separate trains of DC pulses being individually integrated in first and second storage capacitors. A signal proportional to the voltage difference between the outputs of the first and second capacitors is combined with an adjustable reference voltage from a variable tap of a potentiometer to generate the tuning control signal for the oscillator while the conversion factor of the converter is adjusted by means of an auxiliary feedback path driven by a signal proportional to the difference between the output of the second capacitor and a voltage generated at a second tap of the potentiometer.

4 Claims, 1 Drawing Figure

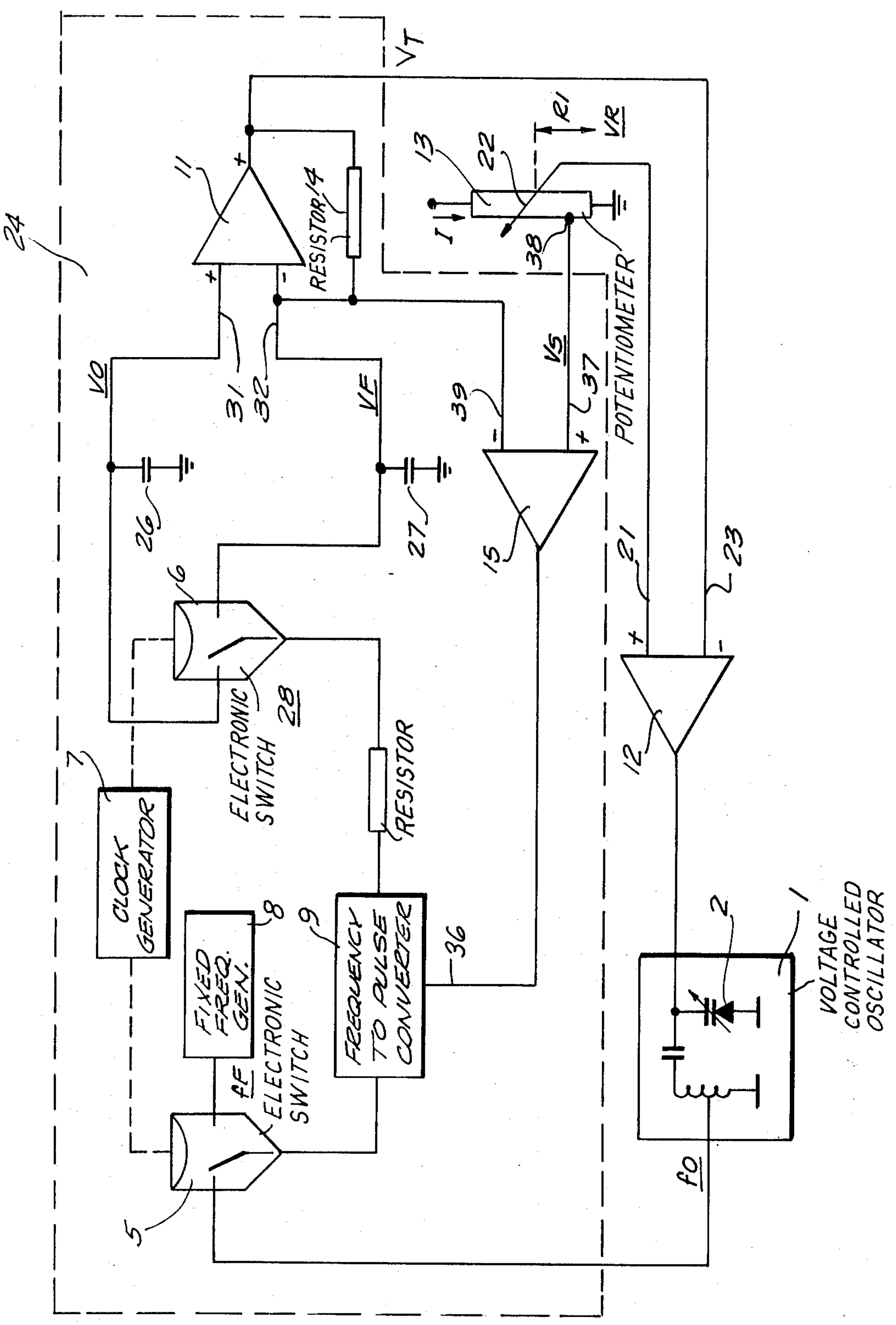
24
11
RESISTOR 14
13
22
R1
VR
VT
I
38
POTENTIOMETER
VO
31
32
VF
39
VS
37
26
27
15
21
23
6
ELECTRONIC SWITCH
28
12
7
CLOCK GENERATOR
RESISTOR
FIXED FREQ. GEN.
8
9
FREQUENCY TO PULSE CONVERTER
36
2
1
VOLTAGE CONTROLLED OSCILLATOR
ELECTRONIC SWITCH
fE
fO
5

FREQUENCY DRIFT COMPENSATION FOR A VOLTAGE CONTROLLED OSCILLATOR

BACKGROUND OF THE INVENTION

Regulation of the frequency of a voltage controlled oscillator in a communications receiver is conventionally accomplished with the use of a feedback path including a converter, (e.g., a monostable multivibrator) that is coupled to the output of the oscillator for translating the instantaneous oscillator frequency to a succession of DC pulses of proportional repetition rate. The DC pulses are integrated in a (first) storage capacitor over a prescribed interval and the resultant DC voltage, whose amplitude varies with the conversion factor of the converter is combined in a differential amplifier with an adjustable reference voltage picked off a variable tap of a potentiometer. The resultant error voltage serves to adjust a variable capacitance diode in the oscillator until the output frequency of the oscillator corresponds to the value of the potentiometer reference voltage.

Such arrangements have in the past been susceptible to oscillator frequency drift resulting from dynamic changes in the conversion factor of the converter, such changes are caused, e.g., by variations of temperature and operating voltage level and result in variations of the voltage across the first capacitor relative to the reference control voltage.

Previous attempts to correct this problem have included the use of bridge circuits responsive to changes in the pulse amplitude at the converter output to proportionally regulate the potentiometer reference voltage. Such arrangements require complex and expensive circuitry and in any event are ineffective to compensate for temperature-induced changes in the width of the DC pulses at the output of the converter.

SUMMARY OF THE INVENTION

An improved technique for isolating the oscillator output frequency from drift caused by dynamic changes in the conversion factor of the converter is accomplished by the present invention. A time-multiplex arrangement including first and second synchronized switches operable at a clock rate is provided to couple the oscillator output frequency to the first storage capacitor through the converter during a first portion of the clock period. During a second portion of such period, the switches operate to couple the output of a separate fixed frequency generator to a second storage capacitor through the same converter. The resulting separate successions of DC pulses at the output of the converter during each of the first and second portions of the clock pulse period are therefore made subject to the same dynamic variations in conversion factor.

The difference between the output voltage of the first and second capacitors are combined with the reference voltage from the variable tap of the potentiometer to provide the error voltage for the oscillator. The output of the second capacitor is also compared with a voltage appearing at a separate tap of the potentiometer, and variations in difference voltage resulting from such comparison are employed to proportionally adjust the conversion factor of the converter, (e.g., by adjustment of the DC pulse width) in a direction to oppose dynamic changes in such factor during circuit operation.

BRIEF DESCRIPTION OF THE DRAWING

The invention will be more fully described in connection with the following detailed description taken in conjunction with the appended drawing, in which the single FIGURE illustrates a frequency drift compensation arrangement for a voltage controlled oscillator in accordance with the invention.

DETAILED DESCRIPTION

The drawing depicts a control arrangement for the output frequency *fo* of a voltage-controlled oscillator 1, which may typically be employed in the tuning stage of a communications receiver; the control arrangement may advantageously be formed as an integrated circuit.

The oscillator 1 is tunable in a conventional manner via adjustment of a variable capacitance diode 2, which is driven by an error control voltage at the output of a differential amplifier 12.

A first input 21 of the amplifier 12 is excited by a selectable reference voltage $V_R$ present at a variable tap 22 of a potentiometer 13. A second (inverted) input 23 of the amplifier 12 is excited by a tuning control voltage $V_T$ derived from a translating circuit 24 in response to the output frequency *fo* of the oscillator 1 to complete a main feedback path around such oscillator.

Certain facilities in the translating circuit 24 are conventional. For example, the translator includes a converter 9, illustratively a monostable multivibrator, which is arranged to convert the oscillator output frequency *fo* into a succession of DC pulses whose repetition rate is proportional to the oscillator frequency. Such pulses are integrated over a prescribed interval in a storage circuit represented for convenience in the drawing as a capacitor 26. The voltage Vo resulting across the capacitor 26 is proportional to the oscillator frequency *fo* and to the conversion factor *k* of the converter 9.

With such arrangement it has been observed that when the output Vo of the capacitor 26 is employed directly as the tuning control voltage $V_T$ at the output of the translating circuit 24, the output frequency *fo* of the oscillator 1 tends to drift because of dynamic changes in the conversion factor *k* of the converter 9; such changes may be caused by temperature and operating voltage variations. Such changes in conversion factor are manifested, e.g., by changes in the pulse width of the DC pulses at the output of the converter 9, and serve to vary the tuning control voltage $V_T$ relative to the reference voltage $V_R$ at the potentiometer tap 22.

In accordance with the invention, the translating circuit 24 is provided with facilities for compensating for these undesired effects. For this purpose the translator circuit further includes a fixed frequency generator 8 (typically a quartz crystal oscillator), a second capacitor 27, a differential amplifier 11 and a time multiplexer 28. The multiplexer employs the converter 9 as a common element to alternately provide, and separately integrate, separate sequences of DC pulses respectively proportional to the fixed output frequency $f_F$ of the generator 8 and the output frequency *fo* of the oscillator 1. The multiplexer 28 operates at a clock rate established by a clock pulse generator 7 and includes a pair of synchronized electronic switches 5 and 6 whose switch positions are indicated schematically in the drawing. During a half period of each clock cycle when the switches 5 and 6 are in their left hand positions shown, the output frequency *fo* of the oscillator 1 is coupled through the converter 9 to the capacitor 26 to obtain the the voltage Vo. During the other half period of each clock cycle, the switches 5 and 6 are in their right hand positions so that the output of the fixed frequency generator 8 is coupled through the converter 9 to the second capacitor 27; in this way, a succession of DC pulses occurring at the frequency of the generator 8 are integrated in the capacitor 27 to yield a voltage $V_F$ which is proportional to the fixed frequency $f_F$ by the conversion factor *k* of the generator 9. In this way, dynamic variations in such factor *k* are reflected identically in the voltages Vo and $V_F$.

The outputs of the capacitors 26 and 27 are respectively coupled to inputs 31 and 32 of a differential amplifier 11. The output of the amplifier 11 is fed back via resistor 14 to the inverting input 32 to form an operational amplifier. The output of the amplifier 11 is employed as the tuning control voltage $V_T$ of the translating circuit 24.

From the above description, it will be seen that such tuning control voltage $V_T$ can be expressed as $$V_T = Vo - V_F = k\ (fo - f_F) \qquad (1)$$

Further, it is seen from the drawing that the voltage $V_R$ at the tap 22 of the potentiometer 13 may be represented by the expression $$V_R = IR_1, \qquad (2)$$

where *R*1 is the resistance between the tap 22 and ground.

Therefore, under equilibrium conditions of the circuit thus far described, (i.e., when the tuning central voltage $V_T$ coincides with the potentiometer reference voltage $V_R$ so that a zero error signal is present at the output of the amplifier 12 the following equation is valid:

$$V_T = V_R = k\ (Fo - f_F) = IR_1, \qquad (3)$$

It follows from (3) that $$fo = f_F\left(1 + \frac{IR_1}{kf_F}\right) \qquad (4)$$

It can be seen from (4) that the oscillator output frequency is subject to residual drift because of dynamic variations in the conversion factor *k*. In further accordance with the invention, such variations of *k* are minimized by providing in the translating circuit 24, an inner feedback path including a differential amplifier 15 whose output controls an auxiliary input 36 of the converter 9. Such auxiliary input acts to control adjustable elements (not shown) in the tuning circuits of the converter 9 in such a way as to vary the conversion factor *k* in proportion to changes in the applied voltage at the input 36 from the amplifier 15. These variations may be manifested, e.g., by suitably altering the pulse width of the output DC pulses.

One input 37 of the amplifier 15 is excited by a voltage $V_s$ at a second fixed tap 38 of the potentiometer 13. A second (inverting) input 39 of the amplifier 15 is excited by the voltage $V_F$ appearing across the capacitor 27.

The operation of such inner feedback loop will be such that upon the attainment of equilibrium, (i.e., when the voltages $V_S$ AND $V_F$ at the inputs of the amplifier 15 are equal), any tendency of the conversion factor *k* of the converter 9 to change dynamically with temperature and/or operating voltage will cause an error correction voltage to be generated at the output of the amplifier 15 and applied to the auxiliary input 36 of the converter in a direction to oppose such change.

Since the same current *I* flows through the taps 22 and 38 of the potentiometer, it is seen that at equilibrium $$V_F = V_S = kf_F = IR_2 \qquad (5)$$

Where $R_2$ is the resistance between the tap 38 of the potentiometer and ground. Therefore, $$k = IR_2/f_F \qquad (6)$$

Substituting (6) in (4), $$fo = f_F\ [1 + (R_1/R_2)\ ] \qquad (7)$$

It is seen from (7) that the operation of the depicted circuit isolates the oscillator frequency *fo* from dynamic changes in the conversion factor *k*, as desired.

The arrangement described above will correct for dynamic changes which, like the contemplated temperature-induced and operating voltage-induced variations, are slow relative to the clock rate of the multiplexer. It will also be observed from a comparison of equations (4) and (7) that the operation of the depicted circuit isolates the oscillator frequency *fo* from temperature-dependent changes in the potentiometer 13 manifested by changes in the current *I*.

For optimum operation, the impedances of the amplifier 12 and 15 should be high relative to that of the amplifier 11. Also, it is desirable that the period of the clock generator 7 be relatively long compared to the lowest frequency *fo* of the oscillator 1, so that a relatively large number of DC pulses from the converter 9 can be integrated in the respective capacitances 26 and 27 during the respective clock half-periods. This serves to relatively minimize disruption in the accumulated voltages *Vo* and $V_F$ across the capacitances 26 and 27 due to occasional spurious transients in the multiplexer 28.

In the foregoing, the invention has been described in connection with preferred arrangements thereof. Many variations and modifications will now occur to those skilled in the art. It is accordingly desired that the scope of the appended claims not be limited to the specific disclosure herein contained.

What is claimed is:

1. For use in a communications receiver including a voltage controlled oscillator wherein converting means translates the instantaneous oscillator output into a succession of DC pulses which have a repetition rate proportional, by an adjustable conversion factor, to the oscillator frequency and which are integrated in a first storage capacitor and wherein a tuning control voltage derived from the integrated output of the first capacitor is compared with a reference voltage obtained from a first variable tap of a potentiometer, the difference between the last-mentioned two voltages being operable to adjust the output frequency of the oscillator, the improvement comprising: a fixed frequency generator; a second storage capacitor; first switching means operable at a clock rate for coupling the output of the oscillator to the input of the converting means during a first portion of each clock period and for coupling the output of the fixed frequency generator to the input of the converting means during a second portion of each clock period; second switching means operable at the clock rate in synchronism with the first switching means for coupling the output of the converting means to the first capacitor during the first portion of each clock period and for coupling the output of the converting means to the second capacitor during the second portion of each clock period; means for operating the first and second switching means at the clock rate; a first differential amplifier having first and second inputs; means for coupling the output of the first capacitor to the first input of the first amplifier; and means for coupling the output of the second capacitor to the second input of the first amplifier, the output of the first amplifier constituting the tuning control voltage.

2. Apparatus as defined in claim 1, in which the clock period is long relative to the period of the lowest oscillator frequency.

3. Apparatus as defined in claim 1, in which the potentiometer has a second tap, in which the converting means includes facilities for externally adjusting the conversion factor in proportion to an applied voltage, and in which the apparatus further comprises in combination, a second differential amplifier having first and second inputs; means for coupling the second tap of the potentiometer to the first input of the second amplifier; means for coupling the output of the second capacitor to the second input of the second amplifier; and means responsive to variations in the output of the second amplifier for proportionally adjusting the conversion factor of the converting means.

4. In a communications receiver including a voltage controlled oscillator wherein converting means whose conversion factor is adjustable translates the instantaneous oscillator output into a succession of DC pulses which have a repetition rate proportional to the oscillator frequency and which are integrated in a first storage capacitor, and wherein a tuning control voltage derived from the integrated output of the first capacitor is compared with a reference voltage obtained from a variable one of two taps of a potentiometer, the difference between the last-mentioned two voltages being operable to adjust the output frequency of the oscillator, an improved arrangement for compensating oscillator frequency drift resulting from dynamic changes in the conversion factor of the converting means, which comprises: a fixed frequency generator; a second storage capacitor; first switching means operable at a clock rate for coupling the output of the oscillator to the input of the converting means during a first portion of each clock period and for coupling the output of the fixed frequency generator to the input of the converting means during a second portion of each clock period; second switching means operable at the clock rate in synchronism with the first switching means for coupling the output of the converting means to the first capacitor during the first portion of each clock period and for coupling the output of the converting means to the second capacitor during the second portion of each clock period; means for operating the first and second switching means at the clock rate; a first differential amplifier having first and second inputs; means for coupling the output of the first capacitor to the first input of the first amplifier; means for coupling the output of the second capacitor to the second input of the first amplifier; the output of the first amplifier constituting the tuning control voltage; a second differential amplifier having first and second inputs; means for coupling the second tap of the potentiometer to the first input of the second amplifier; means for coupling the output of the second capacitor to the second input of the second amplifier; and means responsive to variations in the output of the second amplifier for proportionally adjusting the conversion factor of the converting means.

* * * * *